United States Patent
Ku et al.

(10) Patent No.: US 6,940,770 B2
(45) Date of Patent: Sep. 6, 2005

(54) METHOD FOR PRECHARGING WORD AND BIT LINES FOR SELECTING MEMORY CELLS WITHIN A MEMORY ARRAY

(75) Inventors: Joseph Ku, Palo Alto, CA (US); James Robert Eaton, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 175 days.

(21) Appl. No.: 10/348,645

(22) Filed: Jan. 21, 2003

(65) Prior Publication Data

US 2004/0141393 A1 Jul. 22, 2004

(51) Int. Cl.[7] .................................................. G11C 7/00
(52) U.S. Cl. ..................... 365/203; 365/94; 365/103; 365/105
(58) Field of Search .......................... 365/203, 94, 103, 365/105

(56) References Cited

U.S. PATENT DOCUMENTS

| | | | | |
|---|---|---|---|---|
| 4,570,239 A | * | 2/1986 | Carter et al. | ................. 365/203 |
| 4,858,194 A | * | 8/1989 | Terada et al. | .......... 365/185.25 |
| 5,459,692 A | * | 10/1995 | Shin et al. | ................... 365/203 |
| 5,907,517 A | * | 5/1999 | Komarek et al. | ........... 365/210 |
| 6,496,440 B2 | | 12/2002 | Manning | |
| 6,667,900 B2 | * | 12/2003 | Lowrey et al. | ............. 365/171 |

* cited by examiner

Primary Examiner—VanThu Nguyen
(74) Attorney, Agent, or Firm—Brian R Short

(57) ABSTRACT

The invention includes an apparatus and method of selecting memory cells within a memory array. The method includes receiving a memory cell address. A column address and a row address are generated from the memory cell address. Row select lines or column select lines are pre-charged. A self-timed charging circuit is initiated to provide an adequate amount of time to charge a selected row, and to initiate elimination of static current flowing to unselected rows after a self-timed delay. The other of the row select lines or the column select lines are then pre-charged. Memory cells are selected based upon the column address and the row address. One of two states of the memory cells can be based upon sensing threshold voltages of sense lines that correspond with the selected memory cells.

15 Claims, 10 Drawing Sheets

METHOD FOR PRECHARGING WORD AND BIT LINES FOR SELECTING MEMORY CELLS WITHIN A MEMORY ARRAY

RELATED APPLICATIONS

The present invention is related to concurrently filed, commonly assigned, application Ser. No. 10/347,723, entitled A Low Power Logic Gate.

FIELD OF THE INVENTION

The invention relates generally to electronic memory. More particularly, the invention relates to a method and apparatus for selecting memory cells within a memory array.

BACKGROUND OF THE INVENTION

Computing devices require memory. The memory can include read only memory (ROM) or random access memory (RAM). Generally, memory includes memory cells that are arranged in rows and columns. The individual memory cells are accessed through the use of row select lines and column select lines, typically referred to as word lines and bit lines.

Typically, a computing device accesses data stored in the memory cells of memory through address lines. Each memory cell has a particular address, which allows the computing device to access data stored within each memory cell.

An address decoder receives the address lines, and provides for selection of the proper word line and bit line based upon an address received by the address decoder. As previously described, the word lines and bit lines provide for selection of the memory cells.

ROM devices generally include an array of memory cells. The memory cells are typically configured in rows and columns. Each row generally includes a corresponding word line, and each column generally includes a corresponding bit line. FIG. 1 shows an ROM array of memory cells 110, 120, 140, 150 and corresponding word lines (WL) and bit lines (BL). The ROM memory cells 110, 120, 140, 150 are located at cross-points of the word lines and the bit lines, and each ROM memory cells 110, 120, 140, 150 generally stores a bit of information.

An address decoder 160 receives and address, and generates a row and column selection base upon the address. Generally, a row is selected by a word line selector 180, and a column is selected by a bit line selector 170.

The ROM memory cells 110, 120, 140, 150 include functionality for setting the ROM memory cells 110, 120, 140, 150 to one of at least two logical states. Each logical state represents a bit of information. Additionally, the ROM memory cells 110, 120, 140, 150 include functionality for sensing the logical state of each of the ROM memory cells 110, 120, 140, 150.

The logical state of a ROM cell can be set according to fuse, or anti-fuse ROM technology. A first state of a ROM cell can include a diode connection between the word line and the bit line selecting the ROM cell. A second state of a ROM cell can include an "open circuit" connection (that is, the lack of a connection) between the word line and the bit line selecting the ROM cell. Both of these states are generally easy to detect.

FIG. 2 shows logic gates included within a typical address decoder. The address decoder includes conventional diode-resistor logic (DRL) decoding. The decoder receives address lines A[0], A[1], A[2] and selects a corresponding word line WL[1], WL[2]. Each word line includes a resistor 210, 212 that is connected to a supply voltage potential. If any one of the address line inputs is at a low voltage potential, then the corresponding word line WL[1], WL[2] is pulled down to a low voltage potential (not selected) though the corresponding resistor 212, and a corresponding series diode. A word line is selected if all of corresponding address lines are at a high voltage potential, and the corresponding resistor 210, 212 does not conduct current because none of the corresponding series diodes are conducting current.

Arrows 250 depicts current flow through the logic gates of non-selected word lines. It can be observed from FIG. 2 that the only pull up resistor 210, 212 of the address decoder that does not conduct current is the pull up resistor 210 that corresponds to the selected word line. This can be problematic for large arrays of memory cells because large arrays of memory cells require many word lines. Since all of the word lines except the selected word line include a pull up resistor conducting current, a memory cell array including a large amount of word lines dissipates large amounts of power.

It is desirable to have an apparatus and method for selecting memory cells within an array of memory cells that consumes small amounts of power.

SUMMARY OF THE INVENTION

The invention includes an apparatus and method for selecting memory cells within an array of memory cells that consumes small amounts of power.

An embodiment of the invention includes a method of selecting memory cells within a memory array. The method includes receiving a memory cell address. A column address and a row address are generated from the memory cell address. Row select lines or column select lines are pre-charged. A first delay must be long enough to guarantee that row and column accesses do not overlap. A second delay circuit is initiated that can provide a sufficient amount of time for charging the row select lines. The other of the row select lines or the column select lines are also pre-charged. Memory cells are selected based upon the column address and the row address. One of two states of the memory cells can be sensed by sensing threshold voltages of sense lines that correspond with the selected memory cells.

Another embodiment of the invention includes an apparatus for selecting memory cells within a memory array. The apparatus includes a row decoder for activating a row selection. A column decoder activates a column selection. Row charge holding devices that correspond with row select lines are charged. A delay timing block provides enough time for the selected row line with a heaviest loading to be charged. Column charge holding devices that correspond with column select lines are charged to a low voltage potential. Row charge holding devices that correspond to non-selected row select lines are dis-charged. Column charge holding devices that correspond to non-selected column select lines are charged to a high voltage potential.

Other aspects and advantages of the present invention will become apparent from the following detailed description, taken in conjunction with the accompanying drawings, illustrating by way of example the principles of the invention.

DETAILED DESCRIPTION

Figure 1:
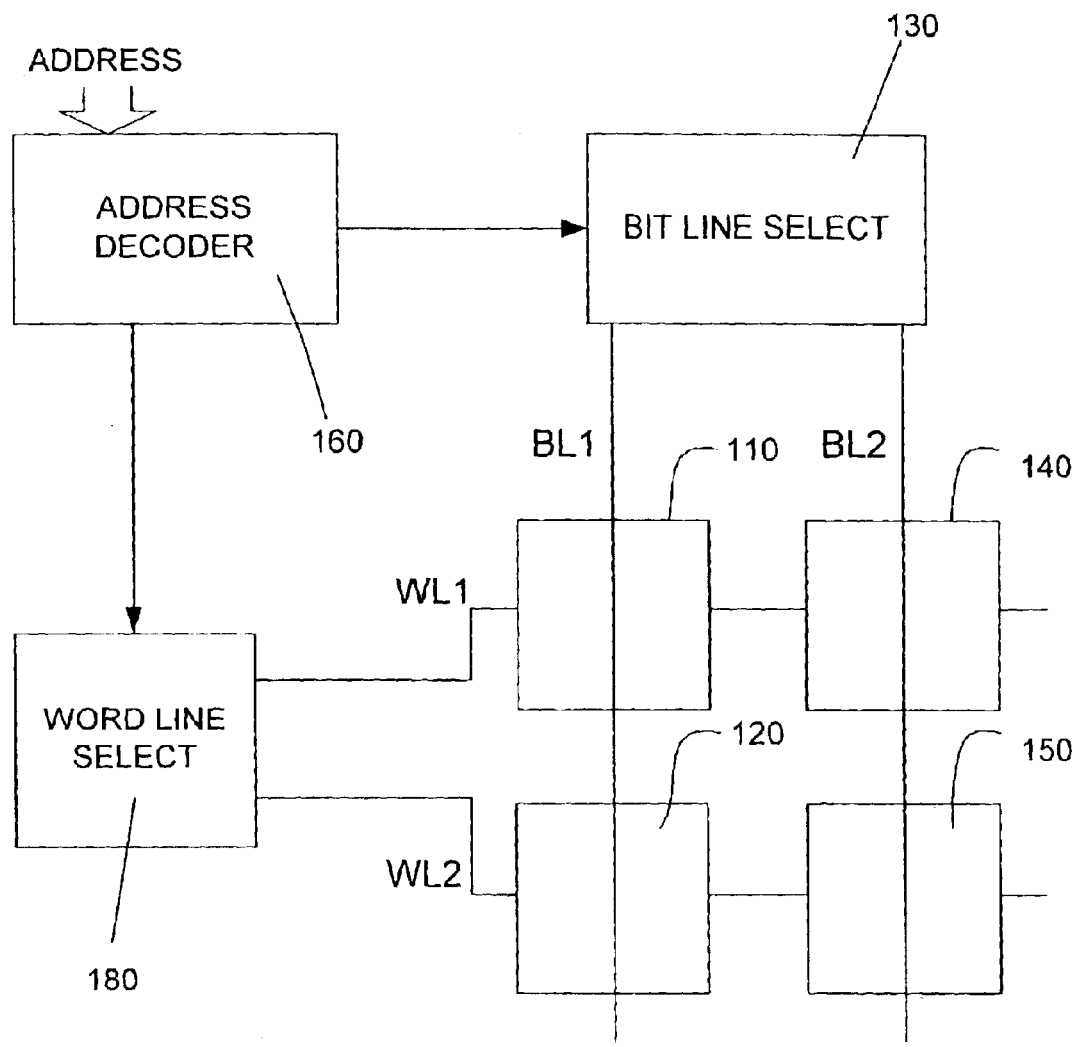
FIG. 1 shows an array of memory cells.
Figure 2:
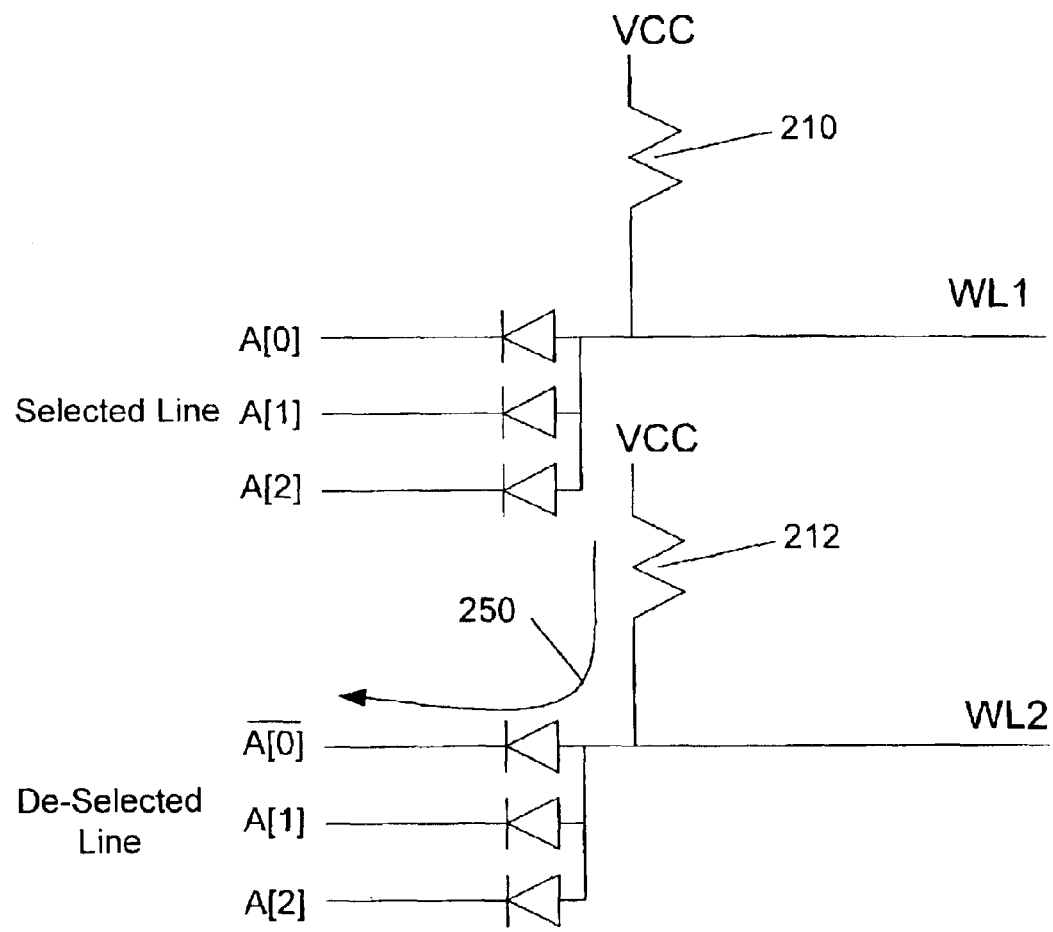
FIG. 2 shows address decoder logic of a typical memory array.

As shown in the drawings for purposes of illustration, the invention is embodied in a method and apparatus for selecting memory cells within an array of memory cells that consumes small amounts of power.

The invention can provide a low power dynamic column decoder by incorporating a single off-substrate pull up transistor, and line voltage de-coupling diodes. The invention can also provide a low power dynamic row decoder by incorporating a single off-substrate pull up transistor with a self-timed delay control. The self-timed delay control allows charging of selected rows to stop when the selected rows have completely charged. De-coupling diodes prevent charge of the selected rows from dis-charging. This memory access protocol sequences operation of the aforementioned circuits to enable the access of memory that requires less power than static memory access circuitry.

For ease of processing, it can be desirable to manufacture read only memory (ROM) integrated circuits so that active devices such as transistors of the ROM are processed separately from passive devices of the ROM such as resistors, diodes, capacitors and inductors. This can be accomplished by manufacturing the ROM as multiple integrated circuits in which active devices are manufactured as an integrated circuit that is separate from a passive devices integrated circuit.

ROM that includes the previously described diode memory elements can be manufactured with the memory elements on an integrated circuit that is separate from the active devices of the ROM. In such an arrangement, it can be advantageous to include the address decoders on the same integrated circuit as the memory elements, because of the possibility of a large number of word lines and bit lines to select the memory elements. Therefore, the address decoders should include passive devices rather than active devices. Diode-resistor logic can be included within passive device address decoders.

Figure 3:
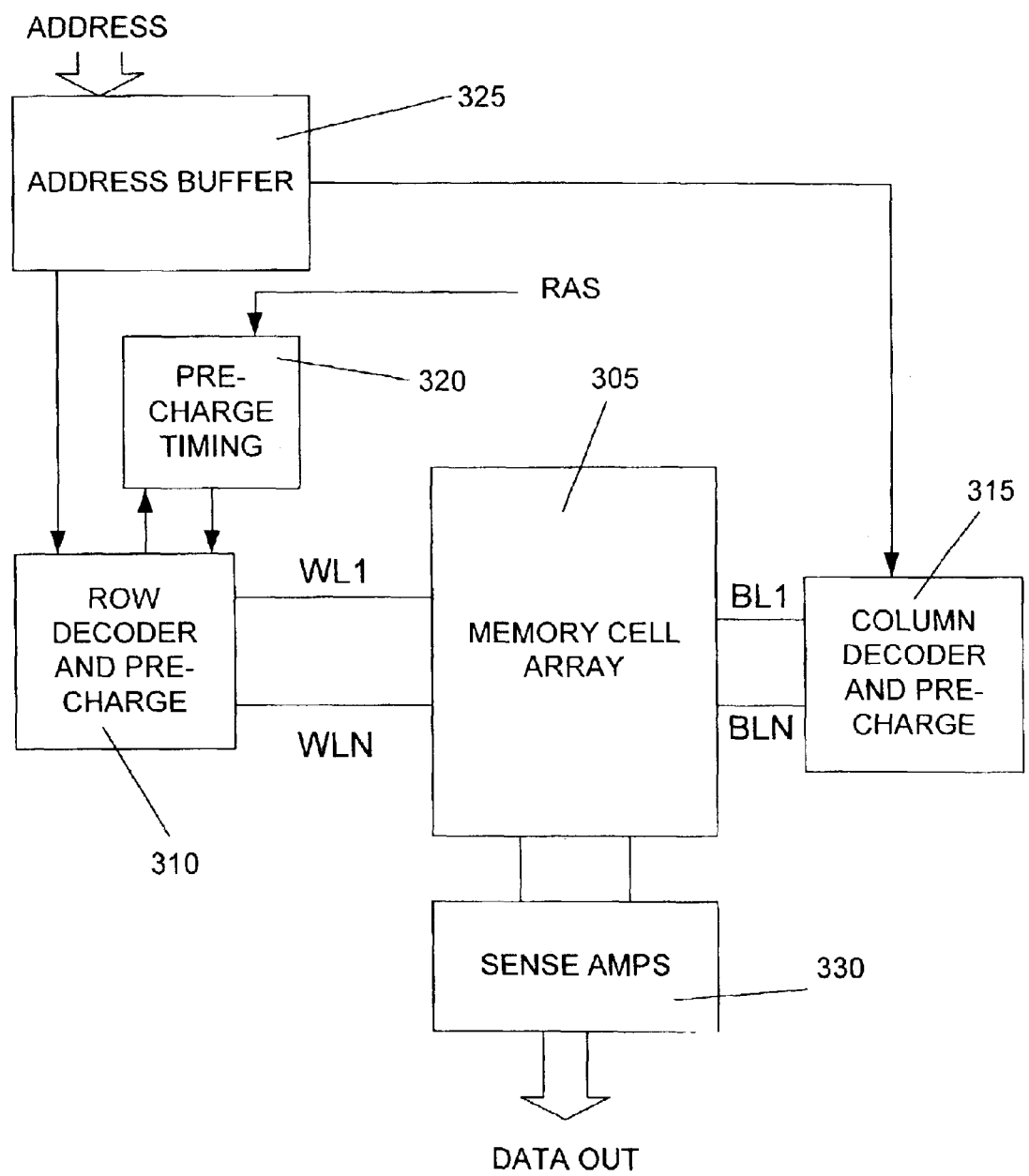
FIG. 3 shows memory array and selection circuitry according to an embodiment of the invention.

FIG. 3 shows memory array and selection circuitry according to an embodiment of the invention. Memory cells within the memory cell array 305 are selected by word lines (WL1—WLN) and by bit lines (BL1—BLN). Generally, the word lines provide selection of rows of memory cells within the memory cell array 305 and the bit lines provide selection of columns within the memory cell array 305.

The word lines are generated by a row decoder and pre-charge block 310. The bit lines are generated by a column decoder and pre-charge block 315. The row decoder and pre-charge block 310, and the column decoder and pre-charge block 315 include passive devices of diode-resistor logic, and consume less power than conventional address decoders.

The embodiment of the invention shown in FIG. 3 includes a pre-charge timing unit 320 (also referred to as a delay circuit). The pre-charge timing unit 320 provides a self-timed (second) delay during the word line selection, to ensure that the heaviest loaded (typically a capacitance load) is provided with an adequate amount of time to properly charge. As will be described later, the row decoder and pre-charge block 310, and the column decoder and pre-charge block 315 are low power address decoders. The amount of power dissipated during selection of a memory cell can be minimized by eliminating static current paths when selecting a memory cell. The pre-charge timing unit 320 minimizes the pre-charge time of static current flow during a word line selection. The pre-charge timing unit 320 receives a RAS (row address strobe) as will be described later.

The embodiment described here include the bit lines being pre-charged before the word lines. Other embodiments can include the word lines being pre-charged before the bit lines.

An address buffer 325 receives an address of a memory cell to be selected within the memory cell array 305. The address buffer generates a row address for the row decoder and pre-charge block 310, and generates a column address for column decoder and pre-charge block 315. Address buffers are well known in the art of memory circuits.

The logical states of the selected memory cells are sensed by sense amplifiers 330, that are connected to the memory cells of the memory cell array 305. This is a standard memory array configuration. The column and row selections provide data out the sense amplifiers 330.

Figure 4:
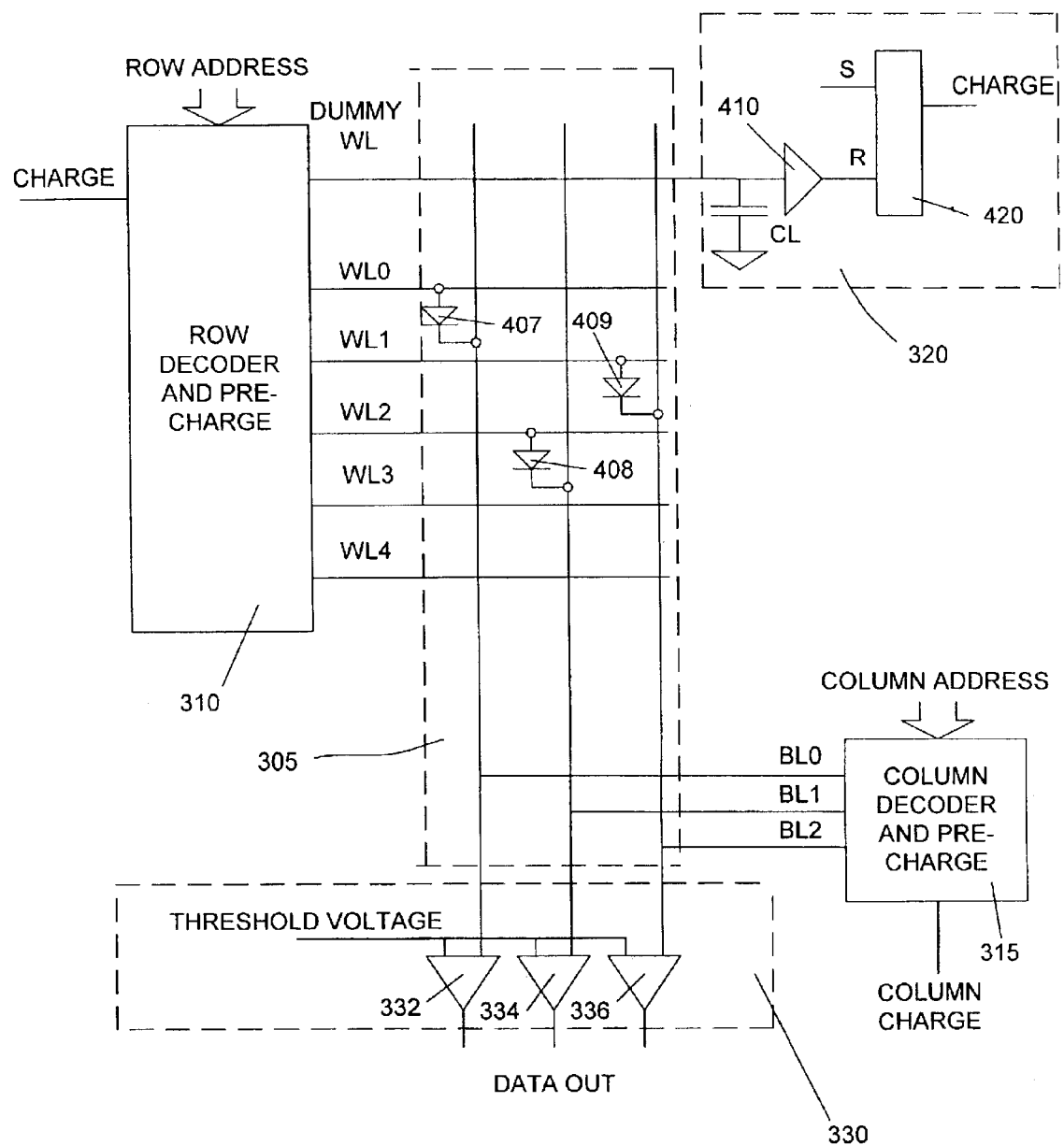
FIG. 4 shows memory array and selection circuitry according to another embodiment of the invention.

FIG. 4 shows memory array and selection circuitry according to another embodiment of the invention. Embodiments of the pre-charge timing unit 320, the memory cell array 305 and the sense amplifiers 330 are shown in greater detail.

As shown in FIG. 4, the pre-charge timing unit 320 receives a signal over a dummy word line. The dummy word line is selected every time a memory cell is being accessed or selected. The dummy word line activates the pre-charge timing unit 320. As will be described later, an embodiment of the invention includes the column selection being initiated before the row selection. It is to be understood that alternate embodiments can include the row selection being initiated before the column selection.

An embodiment of the pre-charge timing unit 320 includes a delay estimate capacitor CL (CL can be a selected capacitor, or CL can represent parasitic capacitance of the dummy word line), a buffer 410 and a logic gate 420. The time delay of the pre-charge timing unit 320 is dependent upon the value of capacitance of the delay estimate capacitor CL. Generally, the capacitance value of the delay estimate capacitor CL is selected to be approximately equal to the largest amount of capacitance of any word line.

The logic gate can be a standard SR flip-flop. The set (S) control of the logic gate will be described later. The reset (R) control of the logic gate is connected to the output of the buffer 410.

Embodiments of the buffer 410 include a preset threshold switch buffer. The preset threshold switch buffer can include a common Schmidt trigger, as is well know in the art of electronics.

The pre-charge timing unit 320 generates a charge (CHARGE) output that initiates pre-charging circuitry within the row decoder and pre-charge block 310. The charge output includes a charging pulse. The charging pulse provides adequate timing to allow the heaviest loaded word line to be properly charged, allowing the sense amplifiers to properly sense the logical states of the corresponding memory cells. The timing of the charging pulse provides for reduced power dissipation.

The column decoder and pre-charge block 315 also receives a charge (COLUMN CHARGE) input. This input initiates pre-charging of circuitry with the column decoder and pre-charge block 315.

The sense amplifiers 330 include several comparators 332, 334, 336. The comparators 332, 334, 336 receive outputs from the selected memory cells. The sensed data out (DATA OUT) of the memory cells are one of two states depending upon whether the sensed voltage from the memory cells is above or below a threshold voltage (THRESHOLD VOLTAGE) of the comparators 332, 334, 336.

It is to be understood that the sense amplifier configuration shown here is merely an example of a possible sense amplifier configuration. More desirable configurations may be possible.

An embodiment includes the threshold voltage being VCC−2VD+0.2 Volts, where VCC is a power supply voltage and VD is a diode voltage potential drop of a forward biased diode junction. The 0.2 Volts margin is chosen as an example for differentiating a logical "high" from a logical "low" of a bit line of a memory array. Other margin voltage potentials can be selected depending upon a sensitivity of the sense amplifiers.

The memory cell array 305 includes memory cells in which a state of each memory cell is determined by whether the memory cell includes a diode or not. That is, a first state of each memory cell includes a diode connection. A second states does not include a diode connection. The memory cell defined by WL0 and BL0 includes a diode 407. The memory cell defined by WL3 and BL1 includes a diode 408. The memory cell defined by WL1 and BL2 includes a diode 409. The presence of a diode within a selected memory cell influences whether or not the input to the corresponding comparator exceeds the threshold voltage.

Figure 5:
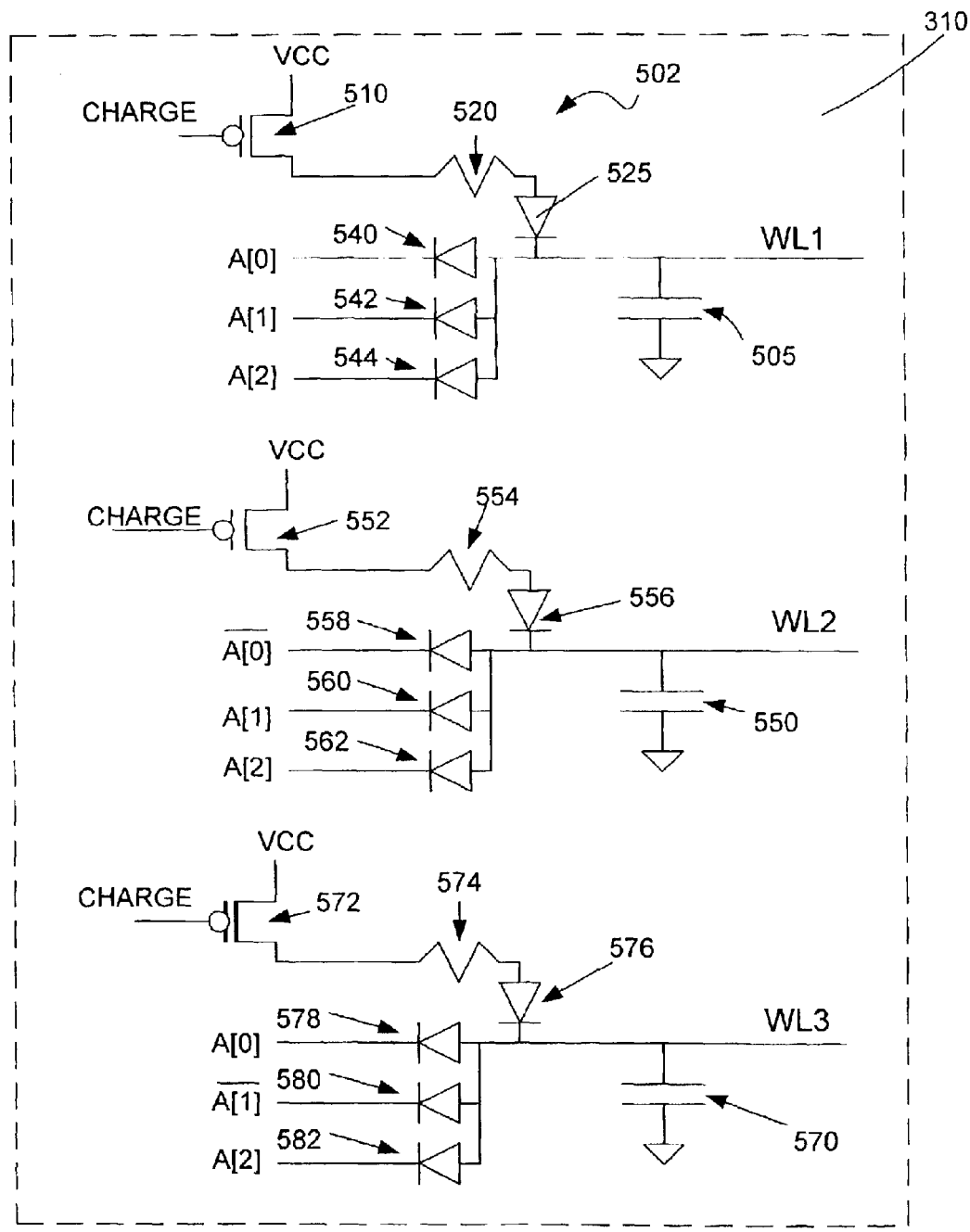
FIG. 5 shows a memory array row decoder according to an embodiment of the invention.

FIG. 5 shows a memory array row (word line) decoder 310 according to an embodiment of the invention. A logic gate is associated with each corresponding word line WL1, WL2, WL3. FIG. 5 only includes three word lines. However, more word lines are typically included.

A first address decoder logic gate 502 provides for selection of the first word line WL1. The first word line WL1 is selected if all of the address lines A[0], A[1], A[2] are at a high voltage potential.

Word line selection begins by charging a charging capacitor 505. The charging capacitor 505 is charged by selecting (applying a voltage potential low enough to turn on charging transistor 510) the CHARGE line. Selecting the CHARGE line causes the charging capacitor 505 to accumulate charge as current flows through a charging transistor 510, a charging resistor 520 and a charging diode 525. The charging resistor 520 is not included in other possible embodiments.

After the charging capacitor 505 has been charged, the CHARGE line can be deselected, allowing for selection of a word line. Generally, the charging capacitor 505 is charged to a voltage potential of VCC−VD, where VCC is the power supply voltage and VD is the forward bias voltage potential of the charging diode 525.

Generally, only one word line Wl1, WL2, WL3 will include a high voltage potential at a time. The word line having the high voltage potential corresponds to the memory cell being selected. All of the other word lines include a low voltage potential. After pre-charging of the charging capacitor 505, the charging transistor is no longer connected to a power supply. Therefore, there is no power dissipation after pre-charging.

The first word line WL1 is selected if all of address lines A[0], A[1], A[2] are at a high enough voltage potential that none of series input diodes 540, 542, 544 are turned on. That is, none of the series input diodes 540, 542, 544 conduct any current. Therefore, the charging capacitor 505 retains all of its charge, and the first word line WL1 is selected.

If any of the address lines A[0], A[1], A[2] have a voltage potential a diode voltage drop lower than the voltage potential of the charging capacitor 505, the corresponding series input diode 540, 542, 544 will conduct current, and the charging capacitor 505 will discharge through the corresponding series input diodes 540, 542, 544. This corresponds with the word line WL1 not being selected.

The second word line WL2 includes a charging capacitor 550, a charging transistor 552, and charging resistor 554 and charging diode 556.

The second word line WL2 is selected if address line A[0] is low (that is, the inversion of A[0] is high), and all of the other address lines A[1], A[2] are at a high enough voltage potential that none of series input diodes 558, 560, 562 are turned on. That is, none of the series input diodes 558, 560, 562 conduct any current. Therefore, the charging capacitor 550 retains all of its charge, and the second word line WL2 is selected.

If any of the address lines A[0] (inverted), A[1], A[2] have a voltage potential a diode voltage drop lower than the voltage potential of the charging capacitor 550, the corresponding series input diode 558, 560, 562 will conduct current, and the charging capacitor 550 will discharge through the corresponding series input diodes 558, 560, 562. This corresponds with the word line WL2 not being selected.

The third word line WL3 includes a charging capacitor 570, a charging transistor 572, a charging resistor 574 and charging diode 576.

The third word line WL3 is selected if address line A[1] is low (that is, the inversion of A[1] is high), and all of the other address lines A[0], A[2] are at a high enough voltage potential that none of series input diodes 578, 580, 582 are turned on. That is, none of the series input diodes 578, 580, 582 conduct any current. Therefore, the charging capacitor 570 retains all of its charge, and the third word line WL3 is selected.

If any of the address lines A[1] (inverted), A[0], A[2] have a voltage potential a diode voltage drop lower than the voltage potential of the charging capacitor 570, the corresponding series input diode 578, 580, 582 will conduct current, and the charging capacitor 570 will discharge through the corresponding series input diodes 578, 580, 582. This corresponds with the word line WL3 not being selected.

The charging diodes associated with each of the word lines, generally provide isolation between a selected word line and all of the non-selected word lines, after a word line selection has been made.

FIG. 5 shows the charging transistors 510, 552, 572 as separate transistors. Generally, however, the charging transistors 510, 552, 572 are actually a single transistor that provides pre-charging of all of the charging capacitors at the same time. A low power dynamic column decoder is provided by combining the single off-substrate charging transistor (that is, a substrate separate from the associated ROM) with the charging diodes (the charging diodes operate as de-coupling diodes).

Figure 6:
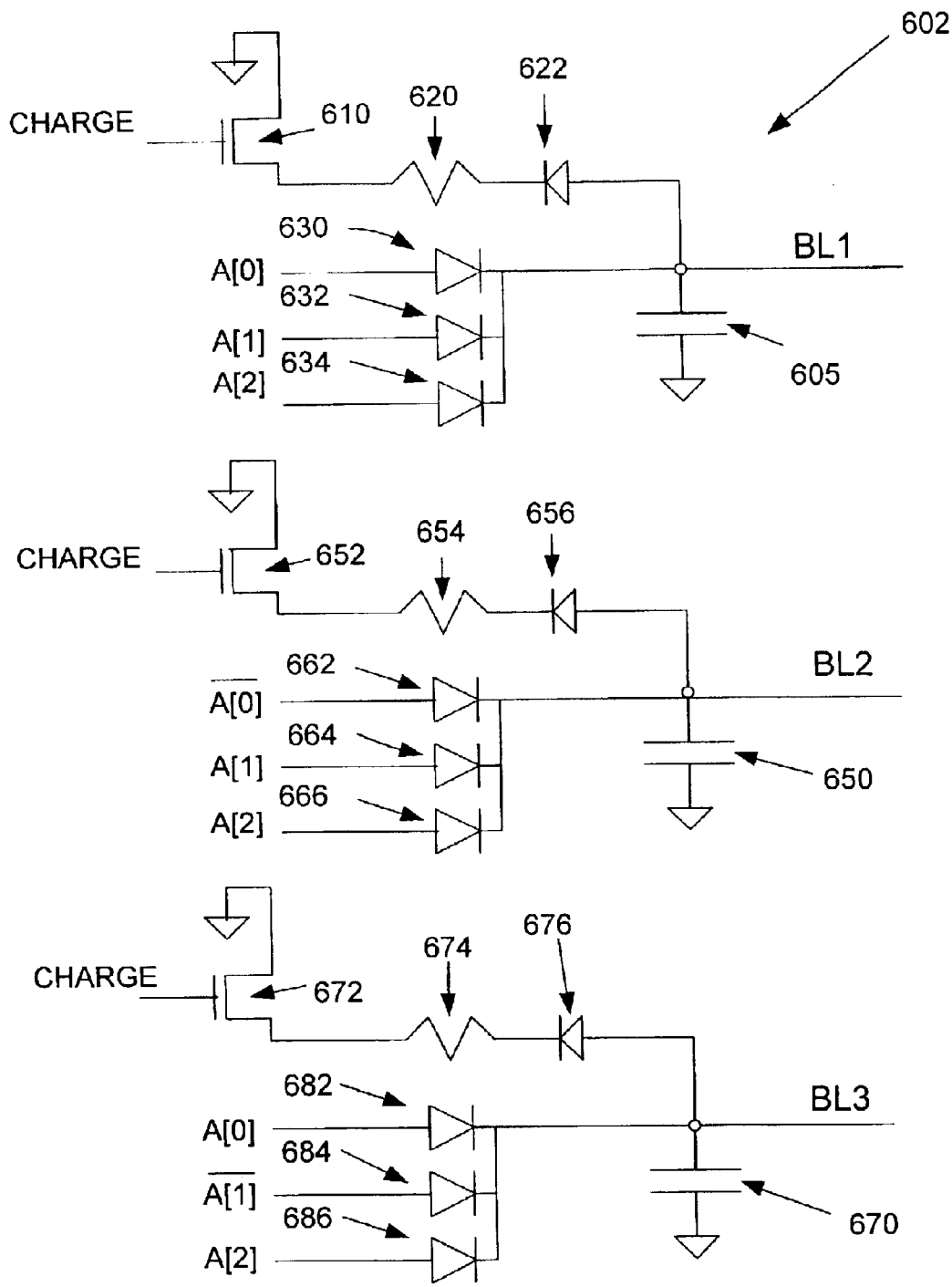
FIG. 6 shows a memory array column decoder according to an embodiment of the invention.

FIG. 6 shows a memory array column decoder according to an embodiment of the invention. A logic gate is associated with each corresponding bit line BL1, BL2, BL3. FIG. 6 only includes three bit lines. However, more bit lines are typically included.

A first address decoder logic gate 602 provides for selection of the first bit line BL1. The first bit line BL1 is selected if all of the address lines A[0], A[1], A[2] are at a low voltage potential.

Bit line selection begins by charging a charging capacitor 605. The charging capacitor 605 is charged by selecting (applying a voltage potential high enough to turn on charging transistor 610) the CHARGE line. Selecting the CHARGE line causes the charging capacitor 605 to establish an initial voltage potential of VD.

The embodiment of FIG. 6 includes a single charging diode 622. However, it is to be understood that the number of charging diodes can be whatever number is required for proper operation of the memory array column decoder. That is, more than a single charging diode connected in series can be included. The number of charging diodes is typically dependent upon the power supply voltage. For example, the embodiment of FIG. 6 is generally adaptable for operation with a 5 Volt power supply. A different number of charging diodes connected in series can be included for 3.3, 2.5 or 1.8 Volt power supplies. The type of diode used can also influence the number of charging diodes because different types of diode can have different forward biased voltage drops.

The charging diodes associated with each of the bit lines, generally provide isolation between a selected bit line and all of the non-selected bit lines, after a bit line selection has been made.

As previously described, the charging transistors can be functionally implemented with a single charging transistor that is located on an active device substrate, that is separate from a ROM substrate. The charging transistor can be connected to the passive circuit ROM substrate through a single interconnect line. A low power dynamic row decoder is provided by combining the single off-substrate charging transistor (that is, a substrate separate from the ROM) with the self-timed delay control (provided by the pre-charge timing unit). The charging diodes (that function as de-coupling diodes) prevent charging capacitors of the selected bit lines from being discharged.

After the charging capacitor 605 has been charged, the CHARGE line can be deselected, allowing for selection of a bit line. Generally, the charging capacitor 505 is charged or discharge to establish an initial voltage potential of VD, which is the forward bias voltage potential of the charging diode 622.

Generally, only one bit line BL1, BL2, BL3 will include a low voltage potential at a time. The bit line having the low voltage potential corresponds to the memory cell being selected. All of the other bit lines include a high voltage potential. After pre-charging of the charging capacitor 605, the charging transistor 610 is turned off. Therefore, there is no power dissipation after pre-charging.

The first bit line BL1 is selected if all of address lines A[0], A[1], A[2] are at a low enough voltage potential that none of series input diodes 630, 632, 634 are turned on. That is, none of the series input diodes 630, 632, 634 conduct any current. Therefore, the charging capacitor 605 maintains a voltage potential of VD, and the first bit line BL1 is selected. It should be noted that the decoder configuration of the embodiment of FIG. 6 utilizes negative logic. That is, a low voltage potential represents a logic "1, and a high voltage potential represents a logic "0".

If any of the address lines A[0], A[1], A[2] have a voltage potential a diode voltage drop higher than the voltage potential of the charging capacitor 605, the corresponding series input diode 630, 632, 634 will conduct current, and the charging capacitor 605 will be charged through the corresponding series input diodes 630, 632, 634. This corresponds with the bit line BL1 not being selected.

The second bit line BL2 includes a charging capacitor 650, a charging transistor 652, a charging resistor 654 and a charging diode 656.

The second bit line BL2 is selected if address line A[0] is high (that is, the inversion of A[0] is low), and all of the other address lines A[1], A[2] are at a low enough voltage potential that none of series input diodes 662, 664, 666 are turned on. That is, none of the series input diodes 662, 664, 666 conduct any current. Therefore, the charging capacitor 650 maintains a voltage potential of VD, and the second bit line BL2 is selected.

If any of the address lines A[0] (inverted), A[1], A[2] have a voltage potential a diode voltage drop higher than the voltage potential of the charging capacitor 650, the corresponding series input diode 662, 664, 666 will conduct current, and the charging capacitor 650 will be charged through the corresponding series input diodes 662, 664, 666. This corresponds with the bit line BL2 not being selected.

The third bit line BL3 includes a charging capacitor 670, a charging transistor 672, a charging resistor 674 and a charging diode 676.

The third bit line BL3 is selected if address line A[1] is high (that is, the inversion of A[1] is low), and all of the other address lines A[0], A[2] are at a low enough voltage potential that none of series input diodes 682, 684, 686 are turned on. That is, none of the series input diodes 682, 684, 686 conduct any current. Therefore, the charging capacitor 670 maintains a voltage potential of VD, and the third bit line BL3 is selected.

If any of the address lines A[1] (inverted), A[0], A[2] have a voltage potential a diode voltage drop higher than the voltage potential of the charging capacitor 670, the corresponding series input diode 682, 684, 686 will conduct current, and the charging capacitor 670 will be charged through the corresponding series input diodes 682, 684, 686. This corresponds with the bit line BL3 not being selected.

FIG. 6 shows the charging transistors 610, 652, 672 as separate transistors. Generally, however, the charging transistors 610, 652, 672 are actually a single transistor that provides pre-charging of all of the charging capacitors at the same time.

Figure 7:
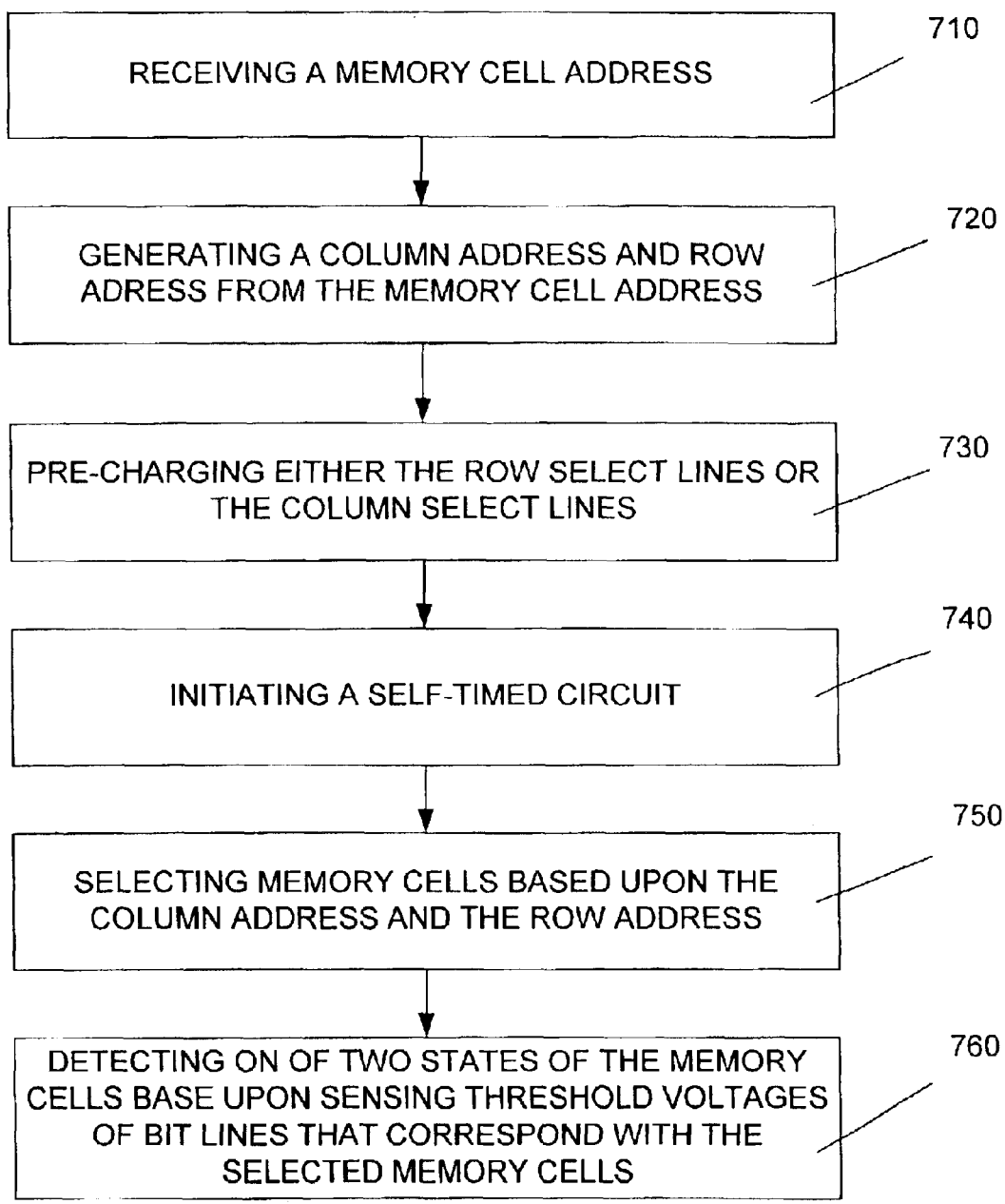
FIG. 7 is a flow chart showing acts according to an embodiment of the invention.

FIG. 7 is a flow chart showing acts according to another embodiment of the invention. This embodiment provides a method of selecting memory cells within a memory array.

A first act 710 includes receiving a memory cell address.

A second act 720 includes generating a column address and a row address from the memory cell address.

A third act 730 includes pre-charging one of row select lines and column select lines.

A fourth act 740 includes initiating a self-timed charging circuit concurrently with selecting a row.

A fifth act 750 includes selecting memory cells based upon the column address and the row address.

A sixth act 760 includes detecting one of two states of the memory cells based upon sensing threshold voltages of a bit lines that correspond with the selected memory cells.

Figure 8:
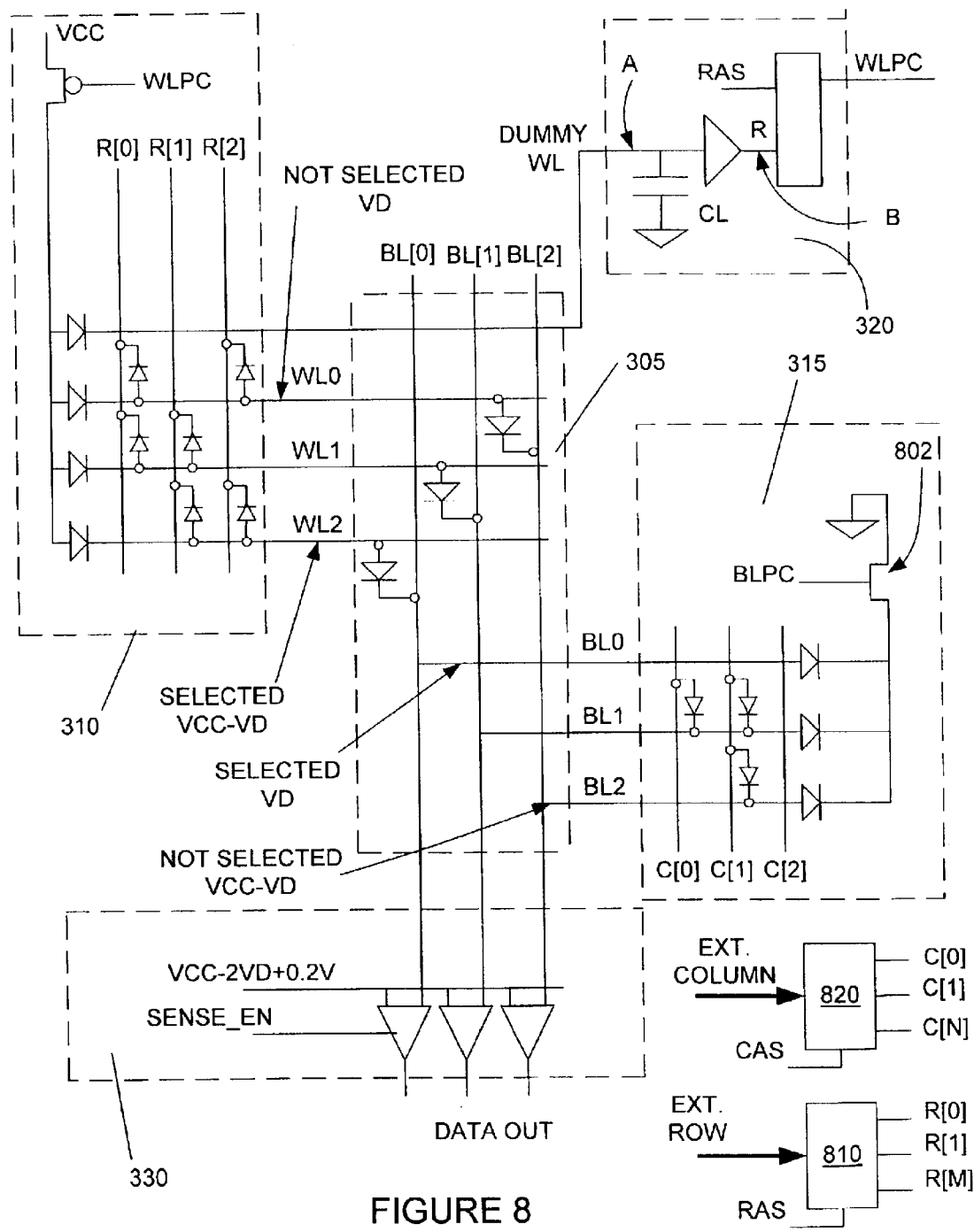
FIG. 8 shows memory array and selection circuitry according to another embodiment of the invention.

FIG. 8 shows memory array and selection circuitry according to another embodiment of the invention. This embodiment includes a specific implementation of the invention, and is not intended to limit the invention. Rather, this embodiment is included to provide an example of an implementation of the invention.

This embodiment includes the previously described memory cell array 305, the row decoder and pre-charge block 310, the column decoder and pre-charge block 315, the pre-charge timing unit 320 and the sense amplifiers 330. This embodiment also includes a row address synchronizer 810, and a column address synchronizer 820.

Controls that must be provided for this embodiment include a row address strobe (RAS) signal, and a columns address strobe (CAS).

The row address synchronizer 810 receives an external row address (EXT. ROW) and synchronizes the external row address with the RAS control signal generating the row address lines R[0], R[1], R[2], and the inverted row address lines.

The column address synchronizer 820 receives an external column address (EXT. COLUMN) and synchronizes the external column address with the CAS control signal generating the column address lines C[0], C[1], C[2], and the inverted column address lines.

As shown in FIG. 8, a selected word line (for example, WL2) includes a voltage potential of VCC-VD. The rest of the word lines are unselected, and include a voltage potential of VD.

Figure 9:
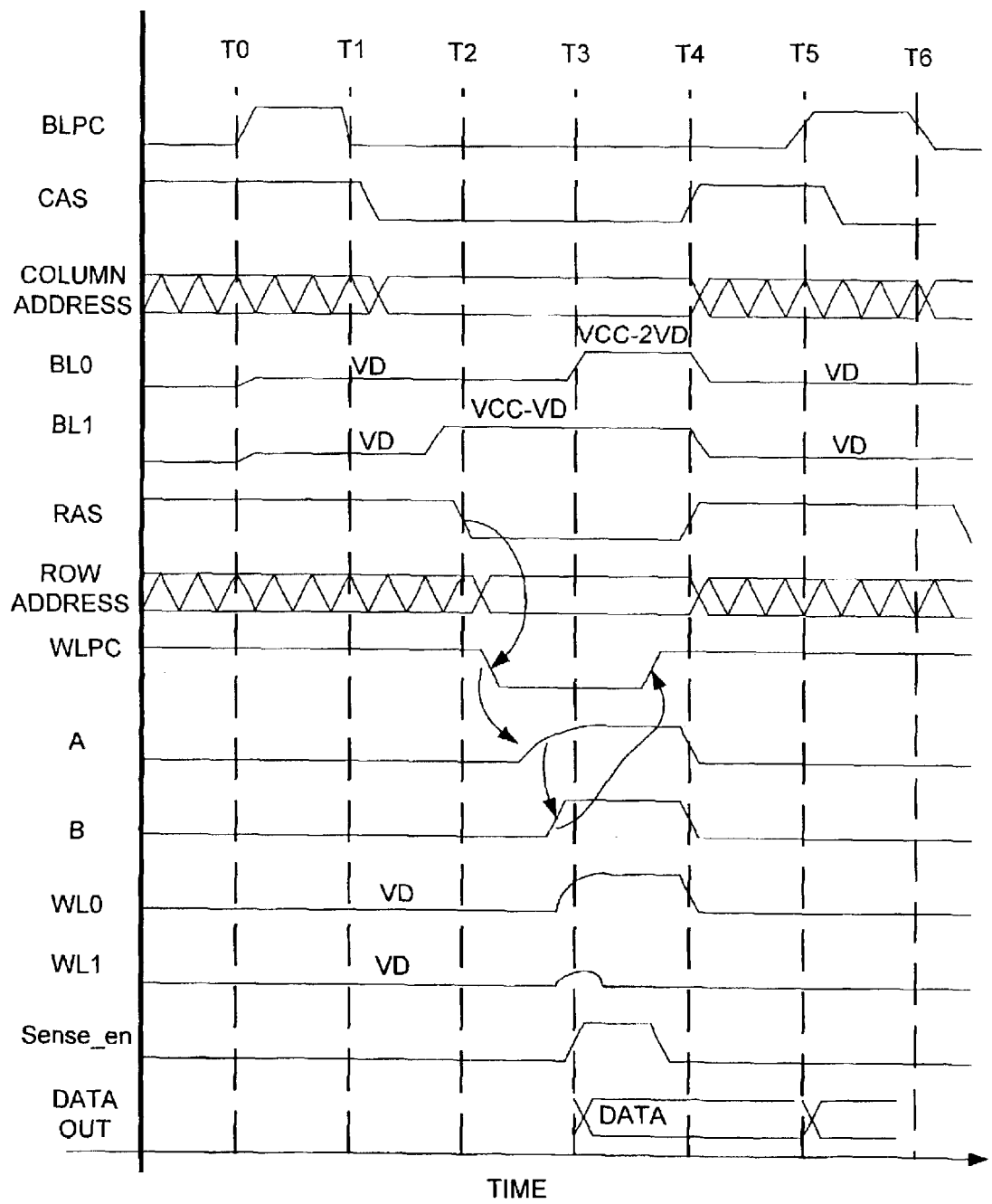
FIG. 9 shows timing waveforms associated with the memory array and selection circuitry of FIG. 8.

A selected bit line (for example, BL0) establishes a voltage potential of VD. The rest of the bit lines are unselected, and include a voltage potential of VCC-VD FIG. 9 shows timing waveforms associated with the memory array and selection circuitry of FIG. 8. The timing waveforms include repeating time cycles T0 through T6.

A bit line pre-charge control line (BLPC) initiates a memory access. When the BLPC control line transitions to a high voltage potential, a BLPC switching transistor 802 turns on, and the column decoder and pre-charge block 315 pre-charges all of the bit lines. After the BLPC control line transitions back to a low voltage potential, the column decoder and pre-charge block 315 is ready to receive a valid column address. The BLPC switching transistor 802 is shown as a NMOS transistor, however, other types of transistors can be used.

A proper column address (C[0] for example) is generated by the column address synchronizer 820 when the column address synchronizer 820 receives a CAS control signal that transition to a low voltage potential. Corresponding bit lines are either selected or non-selected according to the column address generated by the column address synchronizer 820. For this example, bit line B[0] is selected, and bit line B[1] is de-selected.

A proper row address (R[0] for example) is generated by the row address synchronizer 810 when the row address synchronizer 810 receives a RAS control signal that transition to a low voltage potential.

The transition of the RAS control signal also initiates a word line pre-charge (WLPC) control line. The time lines of FIG. 9 include the voltage potentials of points A and B within the pre-charge timing unit 320. The input of the pre-charge timing unit 320 (point A) rises as the delay estimate capacitor CL charges up. When the delay estimate capacitor CL has charged to a high enough voltage potential, the buffer 410 triggers and the output of the buffer 410 (point B) transitions high. The capacitance value of the delay estimate capacitor CL is selected to be greater than the capacitance of any one of the word lines. The provided delay provides de-selection of the WLPC line, which turns off the charging transistor of the word line. The non-selected lines do not conduct any D.C. current, thereby reducing the power required by the ROM decoder.

FIG. 9 shows the waveforms of two word lines W[0] and W[1]. The first word line W[0] is a selected word line, and the voltage potential of the first word line is allowed to transition from a low voltage potential of VD to a high voltage potential of VCC-VD. The second word line W[1] is not allowed to transition to a high voltage potential.

Activating a sense line (SENCE_EN) of the sense amplifiers 330 allows data (DATA OUT) of the selected memory cells to be read. The output of a single sense amplifier of the sense amplifiers 330 is high when the input to the sense amplifier is above the threshold voltage of VCC-2VD+0.2 Volts. This occurs when a diode is present between the selected word line and the selected bit line.

Figure 10:
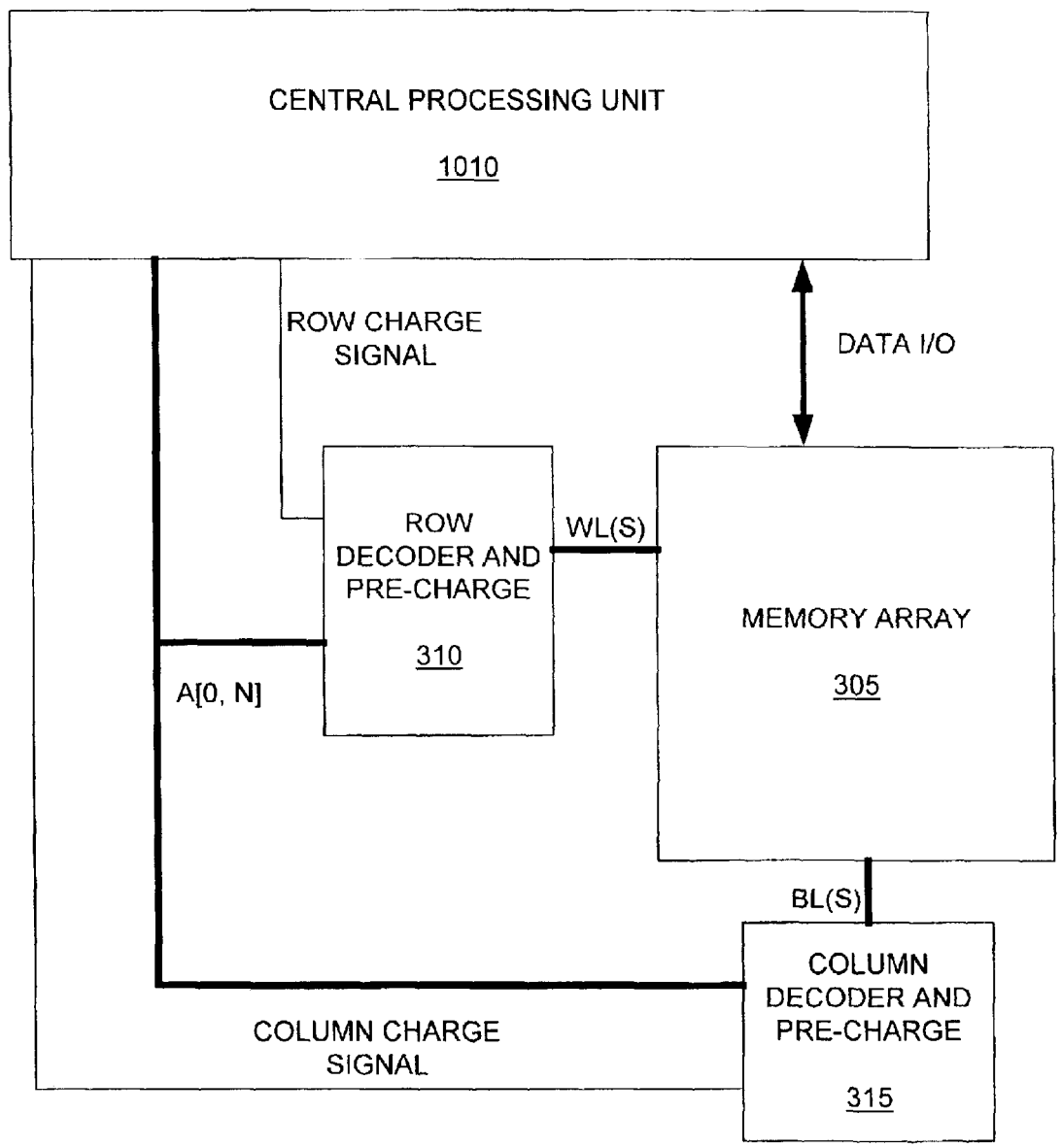
FIG. 10 shows a computing system according to an embodiment of the invention.

FIG. 10 shows a computing system according to an embodiment of the invention. Generally, the computing system includes a central processing unit (CPU) 910 and associated memory system. The memory system can include the row decoder and pre-charge unit 310, the column decoder and pre-charge unit 315, and memory array 305 of FIG. 3 and FIG. 4.

Although specific embodiments of the invention have been described and illustrated, the invention is not to be limited to the specific forms or arrangements of parts so described and illustrated. The invention is limited only by the appended claims.

What is claimed is:

1. A method of selecting memory cells within a memory array, the method comprising:
   receiving a memory cell address;
   generating a column address and a row address from the memory cell address;
   pre-charging row select lines;
   initiating a delay circuit to ensure that a heaviest loaded row select line is properly charged;
   pre-charging column select lines; and
   selecting memory cells based upon the column address and the row address.

2. The method of selecting memory cells within a memory array of claim 1, wherein the delay circuit comprises a self-timed select circuit.

3. The method of selecting memory cells within a memory array of claim 1, wherein pre-charging the row select lines comprises:
   charging a row charge holding device for each row select line;
   dis-charging each row charge holding device if any row address lines associated with the row address is a first voltage potential.

4. The method of selecting memory cells within a memory array of claim 3, wherein each row charge holding device is dis-charged if the row select line corresponding to the row charge holding device is not selected.

5. The method of selecting memory cells within a memory array of claim 3, wherein the first voltage potential is below a threshold voltage potential.

6. The method of selecting memory cells within a memory array of claim 3, wherein a charging transistor for charging the charge holding device is located on a different substrate than the memory array, and a memory array substrate that comprises the memory array includes passive circuit devices.

7. The method of selecting memory cells within a memory array of claim 1, further comprising:

detecting one of two states of the memory cells depending upon weather a sensed voltage of each memory cell is above or below a threshold voltage.

8. The method of selecting memory cells within a memory array of claim 1, wherein the row select lines are word lines.

9. The method of selecting memory cells within a memory array of claim 1, wherein the column select lines are bit lines.

10. The method of selecting memory cells within a memory array of claim 1, wherein a timing delay of the delay circuit estimates a worst case time delay associated with row select lines.

11. The method of selecting memory cells within a memory array of claim 1, wherein initiating the delay circuit comprises:

charging a worst case delay estimate capacitor with a dummy word line select line.

12. The method of selecting memory cells within a memory array of claim 11, wherein the dummy word line is selected upon initiation of access of the memory array.

13. The method of selecting memory cells within a memory array of claim 1, wherein pre-charging the row select lines comprises:

charging charge holding devices corresponding to each of the row select lines;

activating a row select line as a function of charge on a corresponding charge holding device; and dis-charging corresponding charge holding devices if any of a plurality of address lines electrically connected to the charge holding device are below a first voltage potential.

14. The method of selecting memory cells within a memory array of claim 1, wherein pre-charging the column select lines comprises:

pre-charging charge holding devices corresponding to each of the column select lines;

activating a column select line as a function of charge on a corresponding charge holding device; and dis-charging corresponding charge holding devices if any of a plurality of address lines electrically connected to the charge holding device are below a first voltage potential.

15. A method of selecting memory cells within a memory array, the method comprising:

receiving a memory cell address;

generating a column address and a row address from the memory cell address;

pre-charging column select lines;

initiating a delay circuit to ensure that a heaviest loaded column select line is properly charged;

pre-charging row select lines upon activation by the delay circuit; and selecting memory cells based upon the column address and the row address.

* * * * *